(12) United States Patent
Lott

(10) Patent No.: US 7,474,084 B2
(45) Date of Patent: Jan. 6, 2009

(54) CIRCUIT ARRANGEMENT AND METHOD FOR DRIVING A GATE OF A TRANSISTOR, IN PARTICULAR A MOSFET

(75) Inventor: Jörg Lott, Chieming (DE)

(73) Assignee: Patent-Treuhand-Gesellschaft Für Elektrisch Glühlampen mbH, Munich (DE)

(*) Notice: Subject to any disclaimer, the term of this patent is extended or adjusted under 35 U.S.C. 154(b) by 203 days.

(21) Appl. No.: 11/449,837

(22) Filed: Jun. 9, 2006

(65) Prior Publication Data
US 2006/0279890 A1   Dec. 14, 2006

(30) Foreign Application Priority Data
Jun. 10, 2005   (DE) .................... 10 2005 027 013

(51) Int. Cl.
*G05F 1/40* (2006.01)

(52) U.S. Cl. .................. 323/283; 327/538; 318/138
(58) Field of Classification Search .......... 323/282–284, 323/222, 906; 318/254, 138, 432, 439, 700, 318/722, 724; 327/538–541, 349
See application file for complete search history.

(56) References Cited

U.S. PATENT DOCUMENTS 5,801,519 A * 9/1998 Midya et al. ............... 323/222
6,392,372 B1 * 5/2002 Mays, II ................ 318/400.01

* cited by examiner

*Primary Examiner*—Rajnikant B Patel
(74) *Attorney, Agent, or Firm*—Carlo S. Bessone

(57) ABSTRACT

The present invention relates to a circuit arrangement for driving a gate of a transistor, in particular a MOSFET, which is arranged in an electronic ballast, the circuit arrangement (2) being designed for the variable driving of the gate (221) as a function of the operating state of the electronic ballast. The invention also relates to a method for driving a gate of such a transistor.

12 Claims, 3 Drawing Sheets

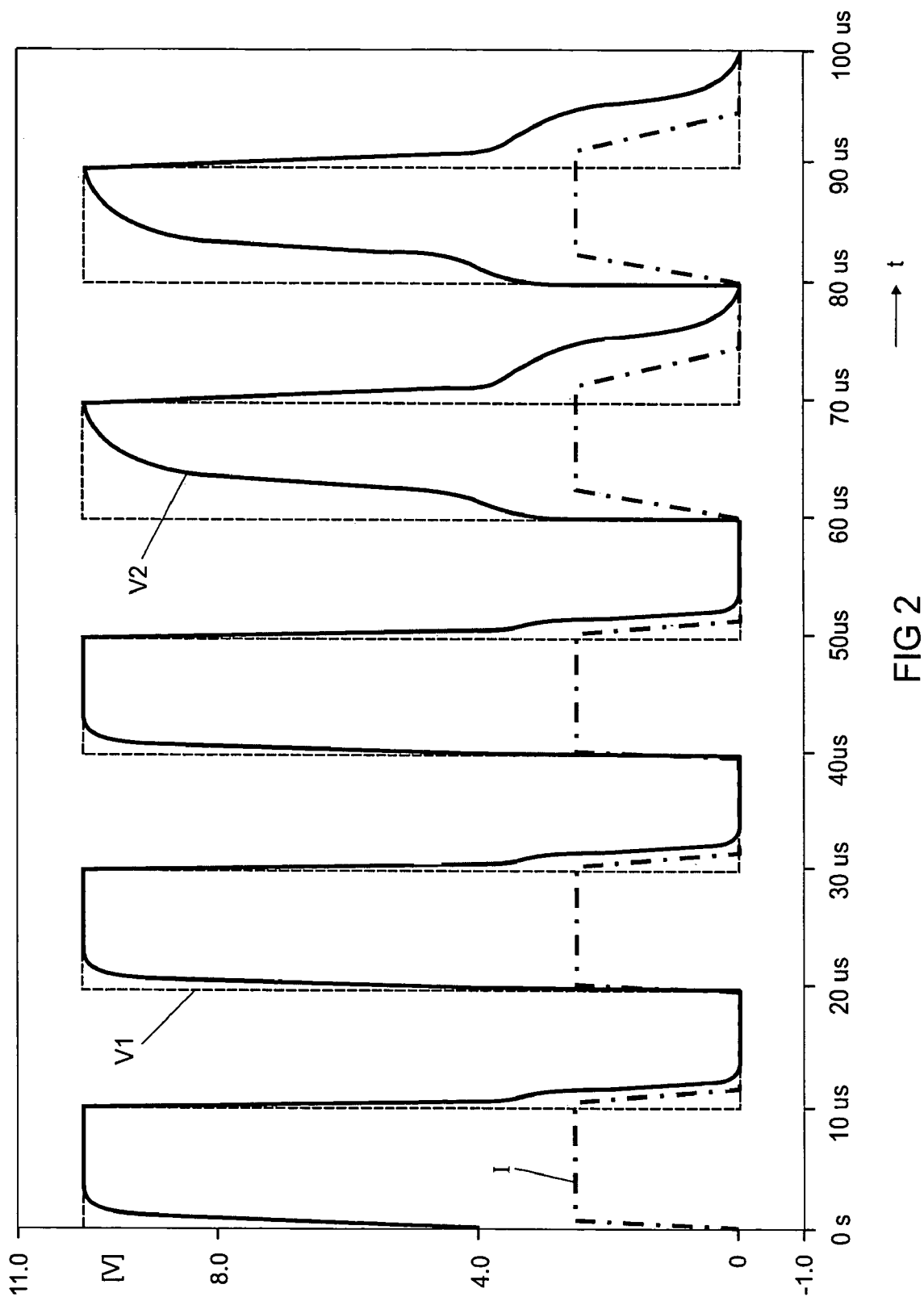

CIRCUIT ARRANGEMENT AND METHOD FOR DRIVING A GATE OF A TRANSISTOR, IN PARTICULAR A MOSFET

BACKGROUND OF THE INVENTION

1. Field of the Invention

The present invention relates to a circuit arrangement for driving a gate of a transistor, in particular a MOSFET. The invention also relates to a method for driving a gate of such a transistor.

2. Description of the Related Art

Prior Art

Circuit arrangements for driving gates of transistors are known. Such a known circuit arrangement is illustrated in FIG. 1. The circuit arrangement 1 comprises a MOS transistor 11, which is electrically connected with its gate 111 to a gate series resistor 12. The gate series resistor 12 is electrically connected to a pulsed DC voltage source 13. As can further be seen in FIG. 1, the drain terminal 112 of the MOS transistor 11 is connected to a load resistor 14, this load resistor 14 being electrically connected to a voltage source 15. Furthermore, the source terminal 113 of the MOS transistor 11 is connected to ground potential. The circuit arrangement 1 illustrated in FIG. 1 is arranged in an electronic ballast, which is used for operating and adjusting fluorescent lamps.

FIG. 2 shows three different signal profiles V1, V2 and I, which are tapped off at points V1, V2 and I in FIG. 1. As can be seen in this case in FIG. 2, the signal profile V1 characterizes a digital voltage profile. The signal profile V2 characterizes the voltage profile at the gate 111 of the MOS transistor 11. Furthermore, the illustration in FIG. 2 represents the signal profile I, which characterizes the current profile 114 through the load resistor 14.

As can be seen from the illustration in FIG. 2, the gate series resistor 12 is switched over from 100 ohms to 400 ohms at time t=55 µs. As can be seen in this case, the signal profile V2 at the gate 111 of the transistor 11 is thus altered and, as a result, the edge steepness of the load current through the load resistor 14 is altered directly, in accordance with the signal profile I. Owing to the change in the switching speed, two opposing properties can be seen. On the one hand, when the resistance value of the gate series resistor 12 is reduced, the switching losses in the circuit arrangement 1 are likewise reduced. However, when there is such a reduction in the resistance value of the gate series resistor 12, the electromagnetic interference (EMI) is increased. When the resistance value of the gate series resistor 12 is increased, the switching losses of the circuit arrangement 1 are increased, in which case the electromagnetic interference is reduced. In practice, it was now possible also to observe the fact that the permissible EMI limit values of an electronic operating device, which is represented, for example, by the HTi DALI 150/220-240 DIM, are not exceeded at dimming settings of the electronic ballast which are substantially greater than 1% of a maximum dimming setting. However, if dimming settings are set which are approximately in the range between 0.1% and 1%, it was possible to establish that the permissible limit values for the electronic converter are being exceeded.

In order to counteract such a case of the permissible limit values being exceeded, in particular at the abovementioned dimming settings, an increase in the gate series resistance was set, as a result of which the EMI response can be improved at all dimming settings. One significant disadvantage with such a procedure, however, is the fact that the power loss is increased at all dimming settings. This in turn leads to relatively high losses in the overall embodiment of an electronic device, in which such a MOS transistor having such a drive circuit is arranged. For example, it is thus necessary for the housing in which the circuit arrangement, in particular the transistor, is arranged to be designed to be larger or for the permissible ambient temperature to be reduced.

SUMMARY OF THE INVENTION

The present invention is therefore based on the object of providing a circuit arrangement and a method for driving a gate of a transistor, with which circuit arrangement and with which method it is possible to overcome the disadvantages of the prior art. In particular, the intention is to achieve a situation in which an improved EMI response can be ensured at all dimming settings and an appropriate adjustment of the power loss can be achieved.

A circuit arrangement according to the invention is designed for driving a gate of a transistor, which is, in particular, a MOSFET, the transistor being arranged in an electronic device. One essential concept of the invention consists in the fact that the circuit arrangement is designed for variably driving the gate of the transistor as a function of the operating state of the electronic device, in which the transistor is used. This makes it possible to achieve a situation in which the power loss can be altered or influenced individually and precisely and losses now only need to be increased in the region in which they are required. The invention can be used to optimize the EMI response at all dimming settings in particular when the circuit arrangement according to the invention is arranged in an electronic ballast. Variable driving of the gate as a function of the operating state of the electronic device makes it possible to set the power loss at all dimming settings depending on the situation and therefore in an efficient and effective manner.

The circuit arrangement advantageously comprises a control unit, which is designed for variably driving the gate of the transistor, the circuit arrangement furthermore also having a gate driver circuit, which can be electrically connected to the control unit (low-side driver) or else has electrical isolation—magnetic or optical or capacitive—for the purpose of driving an upper transistor in a half-bridge arrangement (high-side driver) and can be parameterized by the control unit, the gate driver circuit being electrically connected to the gate of the transistor. The implementation of the circuit arrangement according to the invention is thus relatively low in complexity and has a space-saving design.

The gate driver circuit is preferably connected between the control unit and the gate of the transistor. In this case, the control unit is designed for transmitting a gate driving signal and a parameterization signal to the gate driver circuit. The control unit, which is preferably in the form of a microprocessor, is thus designed for transmitting two separate signals, the gate driving signal and the parameterization signal.

In one advantageous embodiment, the gate driver circuit has an external, fixed gate series resistor and is furthermore designed such that pulse-width modulation, in particular dynamic pulse-width modulation, of the output signal of the gate driver circuit can be carried out at the output of the gate driver circuit. A pulse-width-modulated output signal can thus be provided at the output of the gate driver circuit and can be applied to the gate of the transistor via the external gate series resistor.

In one further advantageous refinement of the invention, the gate driver circuit has an external, fixed gate series resistor and is designed such that an analog-controlled output signal can be provided at the output of the gate driver circuit. The gate driver circuit may preferably have an internally controlled series resistor. With such an implementation, it is thus possible to provide for the arrangement of one or more series resistors and/or current sources in a substrate in a semiconductor component, in which case these internal and controlled series resistors lead to a common terminal, which may advantageously be connected directly to the gate of the transistor to be driven.

In one particularly preferred refinement, the gate driver circuit has a circuit which is graduated in binary fashion and comprises pull-up resistors and pull-down resistors. The pull-up/pull-down resistor combination which is graduated in binary fashion may advantageously have an I²C interface, it being possible for provision to be made for the configuration register to be updated only in the event of a necessary change to the values stored therein.

In one method according to the invention for driving a gate of a transistor, which is in particular in the form of a MOSFET, and in which the transistor is arranged in an electronic device, the gate of the transistor is driven in variable fashion as a function of the operating state of this electronic device. The method according to the invention can thus make it possible for a power loss to be altered, as required, and only to be altered in situations in which this is necessary. Furthermore, with the method according to the invention, which is advantageously carried out in an electronic ballast, it is possible to achieve a situation in which the EMI response can be positively influenced at all dimming settings when setting dimming settings of the electronic ballast. With the method according to the invention, which is carried out in an electronic ballast, it is thus also possible to achieve a situation in which the power loss at all dimming settings can be adjusted, in particular increased, effectively and efficiently as a function of the correspondingly present situation.

BRIEF DESCRIPTION OF THE DRAWINGS

One exemplary embodiment of the present invention will be explained in more detail below with reference to schematic drawings, in which:

FIG. 2 shows signal profiles of signals of the circuit arrangement shown in FIG. 1;

DETAILED DESCRIPTION OF THE PREFERRED EMBODIMENTS

Figure 1:
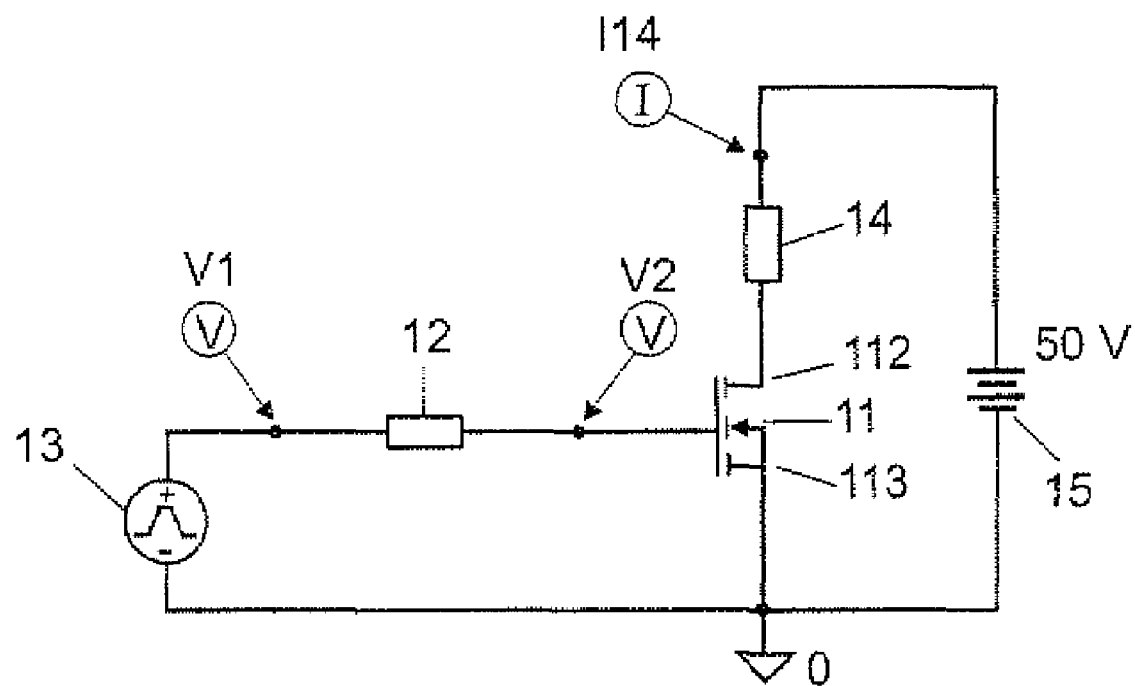
FIG. 1 shows a circuit arrangement known from the prior art for driving a gate of a transistor.
Figure 3:
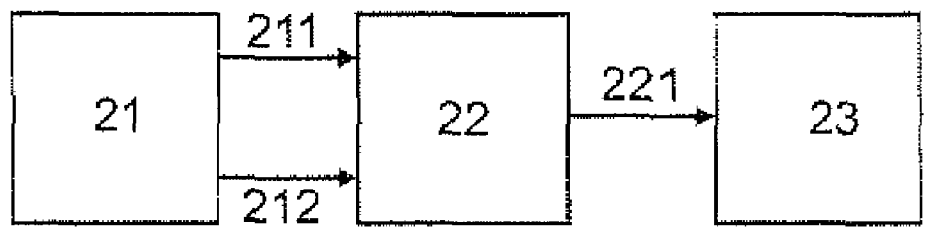
FIG. 3 shows a block circuit diagram of a circuit arrangement according to the invention.

FIG. 3 shows a simplified block circuit diagram of a circuit arrangement 2 according to the invention. The circuit arrangement 2 comprises a control unit, which in the exemplary embodiment is in the form of a microprocessor 21. Furthermore, the circuit arrangement 2 comprises a gate driver circuit 22. As can be seen from the illustration in FIG. 3, the microprocessor 21 is electrically connected to the gate driver circuit 22, the microprocessor 21 being designed for transmitting a gate driving signal 211. The microprocessor 21 is designed for transmitting a parameterization signal 212 to the gate driver circuit 22 via a further signal connection formed in the exemplary embodiment. The gate driver circuit 22 is connected to a transistor, which in the exemplary embodiment is in the form of a MOSFET 23. The electrical connection of the gate driver circuit 22 is in this case formed in particular to send a signal 221 to the gate of the MOSFET 23.

As can already be seen in the illustration in FIG. 3, the circuit arrangement 2 according to the invention is designed for variably driving the gate of the MOSFET 23. In the process, the microprocessor 21 produces both signals, by means of which the operating state of the MOSFET 23 is characterized, and also signals, by means of which parameterization of the gate driver circuit 22 can be carried out. The illustration of the invention shown in FIG. 3 can be used to ensure control of the power loss such that losses are only increased in the region where this is necessary. It is thus no longer necessary in a case in which the circuit arrangement 2 is arranged in an electronic ballast for the power loss to be increased across the board at all dimming settings. Owing to the invention, it is thus possible for such an increase in the power loss for specific dimming settings to be carried out depending on the situation and individually.

Figure 4:
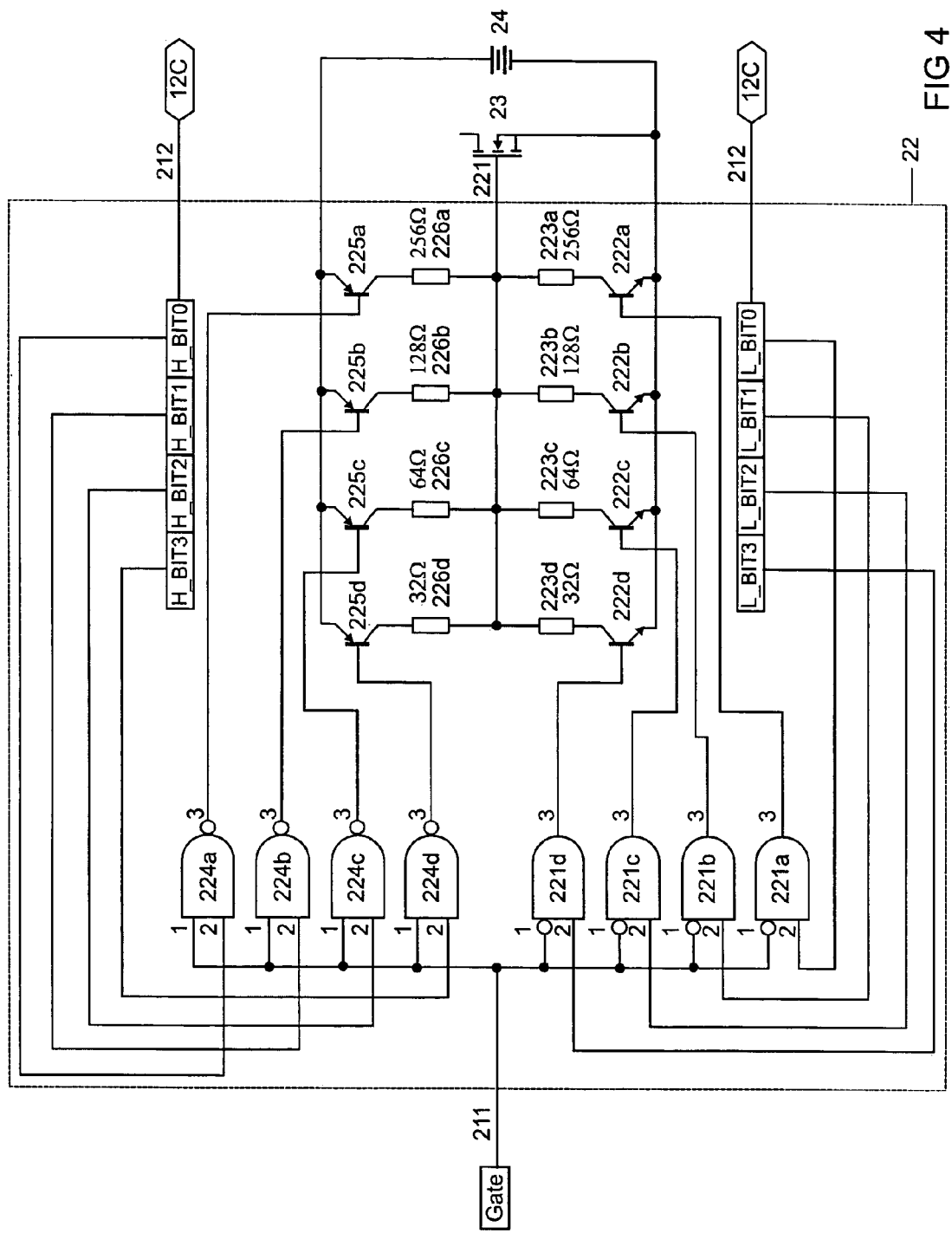
FIG. 4 shows a further illustration of the circuit arrangement according to the invention shown in FIG. 3.

FIG. 4 shows a further illustration of the circuit arrangement 2 according to the invention shown in FIG. 3. As can be seen here, further elements are illustrated in the respective units of the circuit arrangement 2. The gate driver circuit 22 has storage registers, in which states determined by bits stored therein for the transistors associated with the respective storage cell can be realized. In the exemplary embodiment, the gate driver circuit 22 in this case has a register having four bits for the configuration of four npn transistors or bipolar switching transistors 222a to 222d having four collector resistors or pull-down resistors 223a to 223d which are advantageously graduated in binary fashion. In this case, the register is characterized by the bits L_BIT0 to L_BIT3. In a corresponding manner, the gate driver circuit 22 comprises a register, which contains the bits H_BIT0 to H_BIT3 for the configuration of four pnp transistors or bipolar switching transistors 225a to 225d having four collector resistors or pull-up resistors 226a to 226d, which are advantageously graduated in binary fashion.

Furthermore, the microprocessor 21 comprises a unit for producing the gate driving signal 211, and an interface I²C for transmitting the parameters 212 for the gate driver circuit 22, said parameters being stored in the corresponding configuration register. Owing to the bits L_BIT0 to L_BIT3 and H_BIT0 to H_BIT3, it is thus possible for signals to be produced by the microprocessor 21, and these signals are used for parameterizing the gate driver circuit 22.

As can be seen from the illustration in FIG. 4, the gate driver circuit 22 has four AND elements 221a to 221d. The gate driving signal 211 produced by the unit arranged in the microprocessor 21 is in each case applied, inverted, to a first input 1 of the AND elements 221a to 221d. Furthermore, a signal connection to the configuration register having the bit L_BIT0 is formed at a second input 2 of the first AND element 221a. In a corresponding manner, electrical connections between second inputs 2 of the AND elements 221b to 221d and the configuration register having the bits L_BIT1 to L_BIT3 are formed.

Each of the outputs 3 of the AND elements 221a to 221d is in this case connected to in each case one of the bipolar switching transistors 222a to 222d. As can be seen from the illustration in FIG. 4, the outputs 3 of these AND elements 221a to 221d are electrically connected to the base terminals of these bipolar switching transistors 222a to 222d. These bipolar switching transistors 222a to 222d are each connected to ground potential with their emitter terminal. The collector terminal of the switching transistor 222a is electrically connected to a first pull-down resistor 223a, the connector terminal of the switching transistor 222b is electrically connected to a second pull-down resistor 223b, the collector terminal of the switching transistor 222c is electrically connected to a third pull-down resistor 223c, and the collector terminal of the switching transistor 222d is electrically connected to a fourth pull-down resistor 223d.

As can be seen in FIG. 4, the four pull-down resistors 223a to 223d are graduated in binary fashion and, in the exemplary embodiment, have resistance values of 256 ohms and 128 ohms and 64 ohms and 32 ohms, respectively. The four pull-down resistors are electrically connected to a gate 221 of the MOSFET 23.

Furthermore, the gate driver circuit 22 in the exemplary embodiment comprises four inverting AND elements (NAND) 224a to 224d, the gate driving signal 211 produced by the unit of the microprocessor being applied to first inputs 1 of these NAND elements 224a to 224d. Furthermore, an electrical connection is formed between a second input of the NAND element 224a and the configuration register having the bit H_BIT0. In a corresponding manner, electrical connections are formed between the second inputs of the further NAND elements 224b to 224d and the configuration register having the bits H_BIT1 and H_BIT2 and H_BIT3, respectively. As can further be seen in FIG. 4, the outputs 3 of the NAND elements 224a to 224d are each electrically connected to a base terminal of a bipolar switching transistor 225a to 225d. The bipolar switching transistors 225a to 225d are electrically connected with their emitter terminals to a voltage source 24. The collector terminal of the bipolar switching transistor 225a is electrically connected to a first pull-up resistor 226a, the collector terminal of the bipolar switching transistor 225b is electrically connected to a second pull-up resistor 226b, the collector terminal of the bipolar switching transistor 225c is electrically connected to a third pull-up resistor 226c and the collector terminal of the bipolar switching transistor 225b is electrically connected to a fourth pull-up resistor 226d. The four pull-up resistors 226a to 226d are graduated in binary fashion and, in the exemplary embodiment, have resistance values of 256 ohms and 128 ohms and 64 ohms and 32 ohms, respectively. Furthermore, these four pull-up resistors 226a to 226d are electrically connected to the gate 221 of the MOSFET 23.

The "low" bits L_BIT0 to L_BIT3 are designed to isolate the pull-down resistors 223a to 223d. In a corresponding manner, the "high" bits H_BIT0 to H_BIT3 are designed to isolate the associated pull-up resistors 226a to 226d. As is illustrated in the exemplary embodiment of the invention shown in FIG. 4, the gate 221 of the MOSFET 23 can be driven in variable fashion by the circuit arrangement 2 as a function of the operating state of said MOSFET 23 by means of the microprocessor 21 and the gate driver circuit 23.

When the graduated resistors shown in FIG. 4 are implemented internally and thus the resistors are formed in a semiconductor substrate, it is possible for the maximum possible time constants to be matched by means of a capacitor additionally being connected in parallel with the gate 221 of the MOSFET 23.

The invention claimed is:

1. A circuit arrangement for driving a gate of a transistor, in particular a MOSFET, which is arranged in an electronic device,
said circuit arrangement (2) being designed for variably driving the gate (221) as a function of an operating state of the electronic device, in which the transistor (23) is arranged,
the circuit arrangement including:

a control unit (21), which is designed for variably driving the gate (221); and
a gate driver circuit (22), which is connected to the control unit (21) and can be parameterized by the control unit (21), the gate driver circuit (22) being electrically connected to the gate (221) of the transistor (23),
wherein the gate driver circuit (22) has a circuit which is graduated in binary fashion and has pull-up resistors (226a to 226d) and pull-down resistors (223a to 223d), and
a NAND element (224a to 224d) is connected to each pull-up resistor (226a to 226d) via a corresponding pull-up switching transistor (225a to 225d), an AND element (221a to 221d) is connected to each pull-down resistor (223a to 223d), via a corresponding pull-down switching transistor (222a to 222d), and the gate driving signal and the parameterization signal are input to the NAND elements (224a to 224d) and AND elements (221a to 221d).

2. The circuit arrangement as claimed in claim 1,
wherein the gate driver circuit (22) is connected between the control unit (21) and the gate (221) of the transistor (23), and rho control unit (21) is designed for transmitting a gate driving signal (211) and a parameterization signal (212) to the gate driver circuit (22).

3. The circuit arrangement as claimed in claim 1,
wherein the gate driver circuit (22) operates on a fixed gate series resistor and is designed such that a pulse-width-modulated output signal can be provided at the output of the gate driver circuit (22).

4. The circuit arrangement as claimed in claim 1,
wherein the gate driver circuit (22) operates on a fixed gate series resistor and is designed such that an analog-controlled output signal can be provided at the output of the gate driver circuit (22).

5. The circuit arrangement as claimed in claim 1,
wherein the gate driver circuit (22) has an internally controlled series resistor.

6. The circuit arrangement as claimed in claim 1,
wherein the electronic device is in the form of an electronic ballast.

7. A method for driving a gate of a transistor, in particular a MOSFET, which is arranged in an electronic device, comprising:
driving the gate (221) of the transistor (23) in variable fashion as a function of an operating state of the electronic device; and
variably driving the gate (221) with a control unit (21),
wherein a gate driver circuit (22) is connected so the control unit (21) and can be parameterized by the control unit (21), the gate driver circuit (22) being electrically connected to the gate (221) of the transistor (23),
the gate driver circuit (22) is connected between the control unit (21) and the gate (221) of the transistor (23), the control unit (21) is designed for transmitting a gate driving signal (211) and a parameterization signal (212) to the gate driver circuit (22), and the gate driving signal and the gate driving signal select at least one of a plurality of pull-up resistors (226a to 226d) and pull-down resistors (223a to 223d) connected to the gate of the transistor, and
a NAND element (224a to 224d) is connected to each pull-up resistor (226a to 226d) via a corresponding pull-up switching transistor (225a to 225d), an AND element (221a to 221d) is connected to each pull-down resistor (223a to 221d) via a corresponding pull-down switching transistor (222a to 222d) and the gate driving signal and the parameterization signal are input to the NAND elements (224a to 224d) and AND elements (221a to 221d).

8. The circuit arrangement as claimed in claim 2,
wherein the gate driver circuit (22) operates on a fixed gate series resistor and is designed such that a pulse-width-modulated output signal can be provided at the output of the gate driver circuit (22).

9. The method as claimed in claim 7, wherein
the gate driver circuit (22) has an internally controlled series resistor.

10. The method as claimed in claim 7, wherein the gate driver circuit (22) has a circuit which is graduated in binary fashion and has pull-up resistors (226a to 226d) and pull-down resistors (223a to 223d).

11. An electronic device, comprising:
a transistor;
a circuit arrangement configured to drive a gate of the transistor; and
a control unit configured for supplying a signal to said circuit arrangement for variably driving the gate,
said circuit arrangement comprising a gate driver circuit connected to the control unit, the control unit parameterizing the gate driver circuit based on an operating state of the device,
wherein the gate driver circuit is connected between the control unit and the gate of the transistor, the control unit is configured for transmitting a gate driving signal and a parameterization signal to the gate driver circuit, and the gate driving signal and the parameterization signal select at least one of a plurality of pull-up and pull-down resistors connected to the gate of the transistor, and
a NAND element is connected to each pull-up resistor via a pull-up switching transistor, an AND element is connected to each pull-down resistor via a pull-down switching transistor, and the and the gate driving signal and the parameterization signal are input to the NAND elements and AND elements.

12. The electronic device as claimed in claim 11,
wherein the transistor is a MOSFET.

* * * * *